(12) United States Patent
Kanazawa et al.

(10) Patent No.: US 10,136,555 B2
(45) Date of Patent: Nov. 20, 2018

(54) POWER CONVERSION APPARATUS HAVING A METAL PLATE FOR HEAT DISSIPATION

(71) Applicant: Hitachi Automotive Systems, Ltd., Hitachinaka-shi, Ibaraki (JP)

(72) Inventors: Takuro Kanazawa, Tokyo (JP); Kinya Nakatsu, Tokyo (JP); Haruaki Motoda, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 711 days.

(21) Appl. No.: 14/422,624

(22) PCT Filed: Apr. 7, 2014

(86) PCT No.: PCT/JP2014/060056
§ 371 (c)(1),
(2) Date: Feb. 19, 2015

(87) PCT Pub. No.: WO2014/188803
PCT Pub. Date: Nov. 27, 2014

(65) Prior Publication Data
US 2015/0216083 A1  Jul. 30, 2015

(30) Foreign Application Priority Data

May 21, 2013 (JP) .................. 2013-106705

(51) Int. Cl.
*H05K 7/20* (2006.01)
*B62D 5/04* (2006.01)
(Continued)

(52) U.S. Cl.
CPC .......... *H05K 7/20418* (2013.01); *B62D 5/04* (2013.01); *B62D 5/0406* (2013.01); *H02K 7/116* (2013.01);
(Continued)

(58) Field of Classification Search
CPC .......... H02K 9/00; H02K 11/00; H02K 11/33; H02K 7/1166; H02K 9/22; H02K 5/225;
(Continued)

(56) References Cited

U.S. PATENT DOCUMENTS

2003/0160526 A1  8/2003  Becker et al.
2003/0173839 A1*  9/2003  Torii .................. H02K 5/20
                                                  310/52
(Continued)

FOREIGN PATENT DOCUMENTS

JP  11-356006 A  12/1999
JP  2002-188573 A  7/2002
(Continued)

OTHER PUBLICATIONS

International Search Report (PCT/ISA/210) dated Jul. 1, 2014, with English translation (Four (4) pages).
(Continued)

*Primary Examiner* — Tran Nguyen
(74) *Attorney, Agent, or Firm* — Crowell & Moring LLP

(57) ABSTRACT

An inverter (300) is disposed toward an opening in a motor side metal housing (201). A power module (301) is disposed on a metal cover (207) that is in contact with the metal housing (201). The power module (301) includes a semiconductor element, a metal terminal connected to the semiconductor element, and resin that seals the semiconductor element and the metal terminal. A metal plate (306) is disposed on a surface of the power module (301) that is positioned opposite the metal cover (207). Heat generated by the power module (301) is dissipated from the metal cover (207) and from the metal plate (306). This improves the heat dissipation performance. Thus, the size of the power module can be reduced.

4 Claims, 7 Drawing Sheets

(51) Int. Cl.
  *H02K 7/116* (2006.01)
  *H02K 9/00* (2006.01)
  *H02M 7/537* (2006.01)
  *H02K 11/33* (2016.01)
  *H02M 7/00* (2006.01)

(52) U.S. Cl.
  CPC ............ *H02K 7/1166* (2013.01); *H02K 9/00* (2013.01); *H02K 11/33* (2016.01); *H02M 7/537* (2013.01); *H05K 7/209* (2013.01); *H02M 7/003* (2013.01)

(58) Field of Classification Search
  CPC ........... H02K 11/0073; H02K 2209/00; H02K 3/522; H02K 5/08; H02K 11/02; H02K 2203/03; H02K 7/116
  USPC ..................................... 310/51, 52, 68 B, 89
  See application file for complete search history.

(56) References Cited

U.S. PATENT DOCUMENTS

| | | | |
|---|---|---|---|
| 2008/0106160 A1 | 5/2008 | Yoshinari et al. | |
| 2010/0101889 A1* | 4/2010 | Yamaguchi | B62D 5/0406 180/444 |
| 2010/0270958 A1* | 10/2010 | Tsuboi | B62D 5/0463 318/400.26 |
| 2011/0189035 A1 | 8/2011 | Nakagami et al. | |
| 2011/0241198 A1 | 10/2011 | Azuma | |
| 2012/0045353 A1* | 2/2012 | Watanabe | F04B 35/04 417/410.1 |
| 2014/0151146 A1 | 6/2014 | Tanaka et al. | |

FOREIGN PATENT DOCUMENTS

| | | | | |
|---|---|---|---|---|
| JP | 2007-166834 A | 6/2007 | | |
| JP | 2008-82265 A | 4/2008 | | |
| JP | 2008-118067 A | 5/2008 | | |
| JP | 2010-199622 A | 9/2010 | | |
| JP | 2010199622 A * | 9/2010 | ............ | H01L 24/33 |
| JP | 2010-254128 A | 11/2010 | | |
| JP | 2011-157873 A | 8/2011 | | |
| JP | 2011-216822 A | 10/2011 | | |
| JP | 2011216822 A * | 10/2011 | ........... | H01L 23/051 |
| JP | WO 2012137333 A1 * | 10/2012 | ........... | B62D 5/0406 |
| WO | WO 2012/137333 A1 | 10/2012 | | |

OTHER PUBLICATIONS

Korean Office Action issued in counterpart Korean Application No. 10-2015-7003799 dated Sep. 19, 2016 with English-language translation (twelve (12) pages).

* cited by examiner

POWER CONVERSION APPARATUS HAVING A METAL PLATE FOR HEAT DISSIPATION

TECHNICAL FIELD

The present invention relates to a power conversion apparatus that converts electrical power from DC power to AC power or from AC power to DC power, and more specifically, to a method of implementing a power module to which housings for a motor and an inverter are directly connected or implementing a mechatronically integrated power module for which the motor and the inverter are disposed in the same housing.

BACKGROUND ART

The background art related to the above-mentioned technical field is described in PATENT LITERATURE 1 and PATENT LITERATURE 2. Described in PATENT LITERATURE 1 is a molded module that is obtained when a plurality of terminals forming a wiring and a plurality of electronic parts mounted on the individual terminals are molded with molding resin. At least some of the plurality of terminals are exposed from the back surface of molding resin. An electric motor case to which the molded module is fastened is a case that is disposed toward a speed-reducing mechanism and fastened to the speed-reducing mechanism.

Described in PATENT LITERATURE 2 is a power module that includes a heat dissipation layer, an insulating layer, a current circuit wiring section, a plurality of switching elements, a plurality of external terminals, and resin. The heat dissipation layer includes a first principal surface and a second principal surface that is positioned opposite the first principal surface. The insulating layer is disposed on the first principal surface of the heat dissipation layer. The current circuit wiring section is provided for the insulating layer. The plurality of switching elements are disposed on the insulating layer and electrically connected to the current circuit wiring section. The plurality of external terminals are electrically connected to the current circuit wiring section. The resin seals the insulating layer, the current circuit wiring section, the switching elements, the whole of the first principal surface of the heat dissipation layer, and a part of the second principal surface of the heat dissipation layer. The power module is connected to a power module mount of a motor.

CITATION LIST

Patent Literature

PATENT LITERATURE 1: WO2012-137333
PATENT LITERATURE 2: Japanese Patent Application Laid-Open No. 2008-118067

SUMMARY OF INVENTION

Technical Problem

When a conventional mechatronically integrated structure is used to directly connect the housing for a motor to the housing for an inverter or let the motor and the inverter share the same housing, an electric power steering apparatus described, for instance, in PATENT LITERATURE 1 is configured so that the underside of metal wiring for the module is exposed. Therefore, it is necessary to prepare a highly thermal conductive insulating material when connecting the module to a metal housing. Further, if an insulating material having an adhesive force is to be used, it is necessary to perform a process of hardening the insulating material. This results in an increase in manufacturing time. Moreover, in the electric power steering apparatus described in PATENT LITERATURE 1 and PATENT LITERATURE 2, there is only one cooling surface for the module. Therefore, the module needs a large heat dissipation area in order that heat generated by a semiconductor element disposed in the module can be properly conducted to the metal housing side. In such a case, it is difficult to reduce the size of the module.

As described above, when a conventional technology is used, the metal wiring for the power module is exposed to dissipate heat and the exposed surface needs an insulating member. Further, as there is only one cooling surface, a decrease in the heat dissipation area of the module results in an increase in thermal resistance. Hence, the amount of temperature rise in the semiconductor element exceeds a permissible limit. This makes it difficult to reduce the size of the module.

Solution to Problem

A configuration defined, for instance, in the appended claims is employed to solve the above problem.

The present application includes a plurality of means for solving the above problem. According to an example of such means, there is provided a power conversion apparatus having a motor and an inverter. At least one power module for the inverter is disposed on a metal housing for the motor. A heat dissipation metal plate is disposed on a surface of the power module that is positioned opposite its surface in contact with the metal housing.

Advantageous Effects of Invention

According to the present invention, one surface of the power module provided for the inverter is in contact with the metal housing for the motor, and the other surface is in contact with the heat dissipation metal plate. Therefore, heat generated by the power module can be dissipated from both surfaces. This makes it possible to implement a power conversion apparatus having high heat dissipation performance. As a result, the size of the power module can be considerably reduced.

Configurations and advantageous effects other than those described above will be apparent from the following description of embodiments.

DESCRIPTION OF EMBODIMENTS

Embodiments of the present invention will now be described with reference to the accompanying drawings. However, the present invention is not limited to the following embodiments.

First Embodiment

A first embodiment of the present invention will be described based on an example of a power conversion apparatus having an inverter for converting electrical power and a motor for converting electrical energy to mechanical energy.

Figure 1:
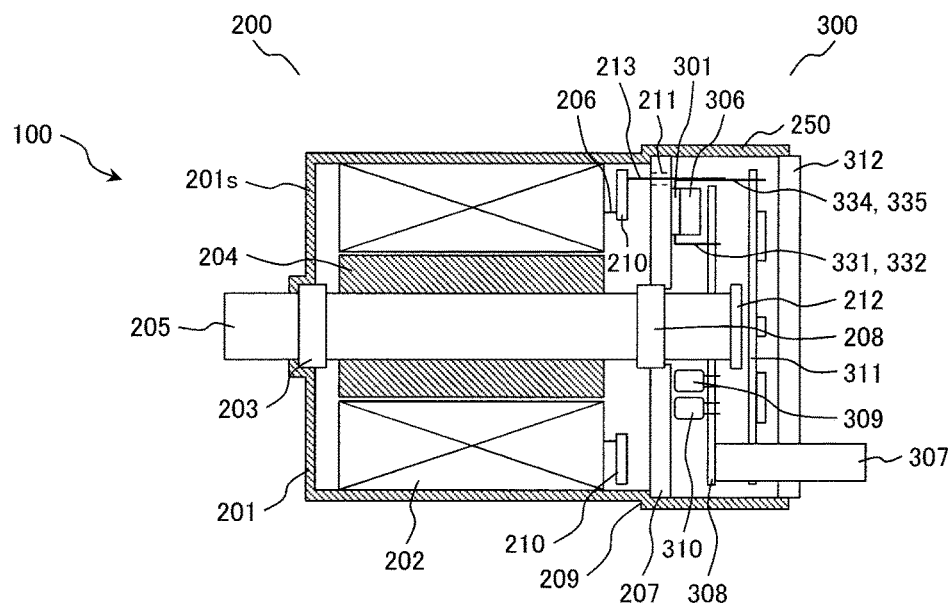
FIG. 1 is a cross-sectional view illustrating a power conversion apparatus according to a first embodiment of the present invention.

FIG. 1 is a cross-sectional view taken in axial direction of the motor 200 to illustrate a configuration of the power conversion apparatus 100 according to the first embodiment. The power conversion apparatus 100 includes the motor 200, which has a stator 202 and a rotor 204, and the inverter 300, which includes a motor drive circuit.

The stator 202 for the motor 200 is formed of a stator winding around an electromagnetic steel plate. The stator 202 is circularly disposed on the inner side of a cylindrical motor side metal housing 201 and secured, for instance, by press fitting or shrink fitting. Further, a space for securing a bearing 203 is provided at the center of a blocking section 201s that blocks an opening in one axial end of the motor side metal housing 201. The bearing 203 is secured by press fitting.

An opening in the other axial end of the motor side metal housing 201 is provided with a metal cover 207 and a spigot structure 209. The metal cover 207 secures another bearing 208. The spigot structure 209 connects to the metal cover 207. The bearing 208 is press-fit to the metal cover 207. The metal cover 207 is fastened to the motor side metal housing 201, for instance, by screwing or press fitting.

Although not shown, the other axial end of the metal housing 201 on the side toward the motor 200 is provided with a screwing section for connecting to a cover 312 on the side toward the inverter 300. The screwing section is disposed, for instance, on the outer side (outer circumference) of the spigot structure 209 on which the metal cover 207 is disposed. Further, a portion of the metal housing 201 that is positioned toward the inverter 300 (250) may be formed of a member different from the member for the metal housing 201.

The inverter 300 is disposed between the metal cover 207 and the other axial end of the motor side metal housing 201. A printed circuit board 308 is disposed on a portion that is positioned at a predetermined distance from the metal cover 207 and toward the other axial end of the motor side metal housing 201. A printed circuit board 311 is disposed between the cover 312, the printed circuit board 308, and the other axial end of a shaft 205.

The stator winding for the stator 202 is formed of three-phase windings, namely, U-, V-, and W-phase windings. Wirings for the individual stator windings are electrically connected by a terminal busbar 210 that is molded with insulating resin. A wiring method for the stator winding may be either a Y wiring method or a Δ wiring method. Further, U-, V-, and W-phase metal wirings 213 are axially extended from the terminal busbar 210 and routed through a hole 211 in the metal cover 207.

The rotor 204 is formed of the shaft 205 and a permanent magnet that is secured to the outer circumference of the shaft 205. The rotor 204 can rotate due to the bearings 203, 208 and a rotating magnetic field that is generated when a current flows to the stator winding. For example, neodymium or ferrite may be used as a material of the permanent magnet.

Figure 2A:
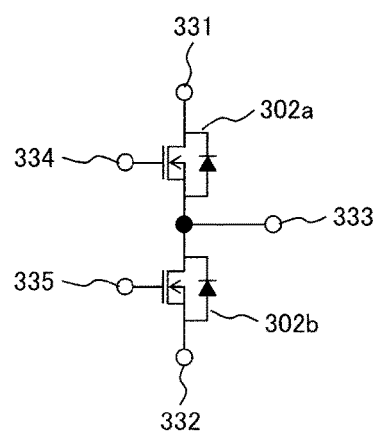
FIGS. 2A and 2B are circuits diagram illustrating a power module provided for the power conversion apparatus according to the first embodiment of the present invention.
Figure 2B:
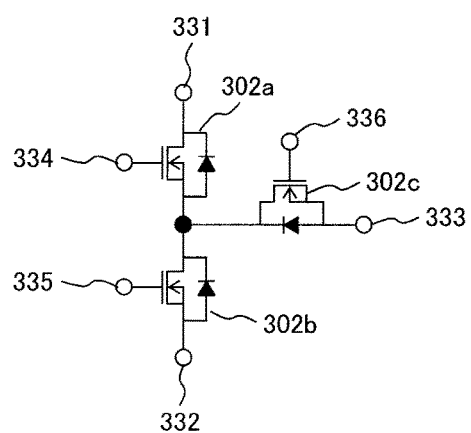

A power module 301 for the inverter 300 is disposed on the metal cover 207. FIG. 2 is a circuit diagram illustrating the power module 301. The power module 301 incorporates semiconductor elements 302a, 302b (FIG. 2(a)) or semiconductor elements 302a-302c (FIG. 2(b)). The semiconductor elements 302a-302c are used for power conversion. For example, an IGBT or MOSFET may be used as the semiconductor elements 302a-302c.

Figure 3:
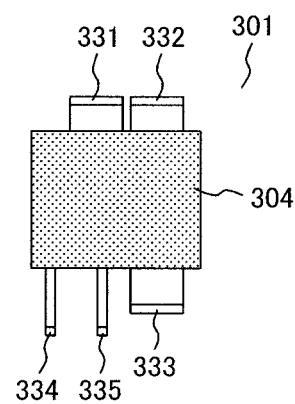
FIG. 3 is a plan view illustrating the power module provided for the power conversion apparatus according to the first embodiment of the present invention.

The semiconductor elements 302a, 302b shown, for instance, in FIG. 2(a) and a metal wiring 303 (not shown) electrically connected to the semiconductor elements 302a, 302b are covered with insulating resin 304 as shown in FIG. 3. Individual terminals connected to the metal wiring are exposed outward from the resin 304.

FIG. 3 is a plan view illustrating the power module 301. A positive wiring terminal 331, a negative wiring terminal 332, a phase output terminal 333, a gate terminal 334, and a gate terminal 335 are exposed outward from the resin 304. The positive wiring terminal 331 is at the same potential as a drain electrode of the semiconductor element 302a. The negative wiring terminal 332 is at the same potential as a source electrode of the semiconductor element 302b. The phase output terminal 333 connects to a motor winding. The gate terminal 334 is electrically connected to a gate electrode of the semiconductor element 302a for an upper arm. The gate terminal 335 is electrically connected to a gate electrode of the semiconductor element 302b for a lower arm.

The figure shows that the gate terminals 334, 335 protrude from the same side as the phase output terminal 333. Alternatively, however, the gate terminals 334, 335 may protrude from the same side as the positive and negative terminals 331, 332 or protrude from a lateral side that is angled at 90 degrees from the above-mentioned side. Further, the individual output terminals may be bent at different positions and may differ in length. The individual output terminals may be adapted as appropriate as far as they are easily connected to the terminal busbar 210 and the printed circuit boards 308, 311.

FIG. 2(b) shows an example of the power module, which includes the semiconductor elements 302a, 302b for the upper and lower arms and the motor output side semiconductor element 302c. The motor output side semiconductor element 302c is connected between the phase output terminal 333 and a common connection point for the semiconductor elements 302a, 302b.

The power module shown in FIG. 2(b) is configured in the same manner as shown in FIG. 3. More specifically, the three semiconductor elements 302a-302c and the metal wiring are sealed with the insulating resin 304, with the individual terminals 331-335 exposed outward from the resin 304.

Figure 4:
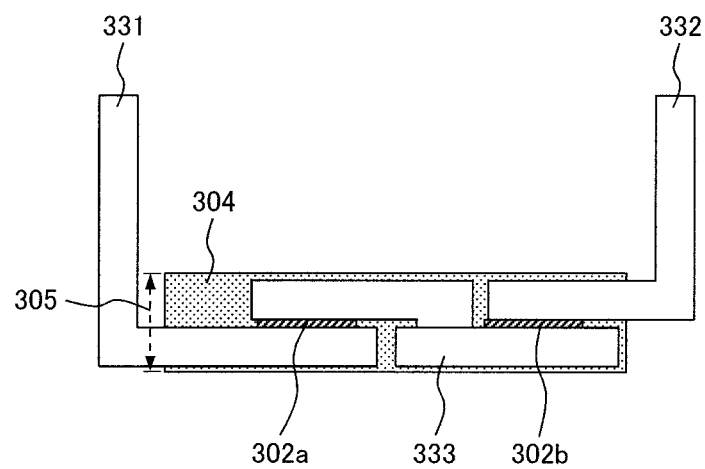
FIG. 4 is a cross-sectional view illustrating the power module provided for the power conversion apparatus according to the first embodiment.

FIG. 4 is a cross-sectional view illustrating the power module in which the two semiconductor elements 302a, 302b shown in FIG. 2(a) are covered with the resin 304. Referring to FIG. 4, the positive wiring terminal 331 formed of a metal is connected to the drain electrode of the semiconductor element 302a for the upper arm, and the phase output terminal 333 is connected to a source electrode of the same semiconductor element 302a. These terminals are connected, for instance, by soldering. Further, the phase output terminal 333 is connected to a drain electrode of the semiconductor element 302b, and the negative wiring terminal 332 formed of a metal is connected to the source electrode of the same semiconductor element 302b. These terminals are connected, for instance, by soldering.

The phase output terminal connected to the semiconductor element 302a and the phase output terminal connected to the semiconductor element 302b need not be formed of one metal plate. Each of these phase output terminals may be formed of two or more metal plates.

For example, copper, which exhibits low electrical resistance, or aluminum, which is low in specific gravity, may be used as a material of the above-mentioned metal terminals. Although not shown, a metal wiring is electrically connected to the gate electrodes of the semiconductor elements 302a, 302b. For example, the electrodes of the semiconductor elements may be electrically connected to metal terminals by direct soldering or by wire bonding using aluminum or the like.

For example, a transfer molding method may be used as the method of covering with the insulating resin 304. Epoxy resin or the like may be used as the resin 304. It is preferred that the resin 304 have a thermal conductivity of 3 W/(m·K) or higher. Further, it is preferred that the thickness 305 of the resin covering the metal terminals 331-335 be not greater than 300 μm. Covering the semiconductor elements 302a, 302b with the resin 304 reduces the stress applied to solder or other joining material due to a difference in a linear expansion coefficient between the semiconductor elements and metal terminals.

Figure 5:
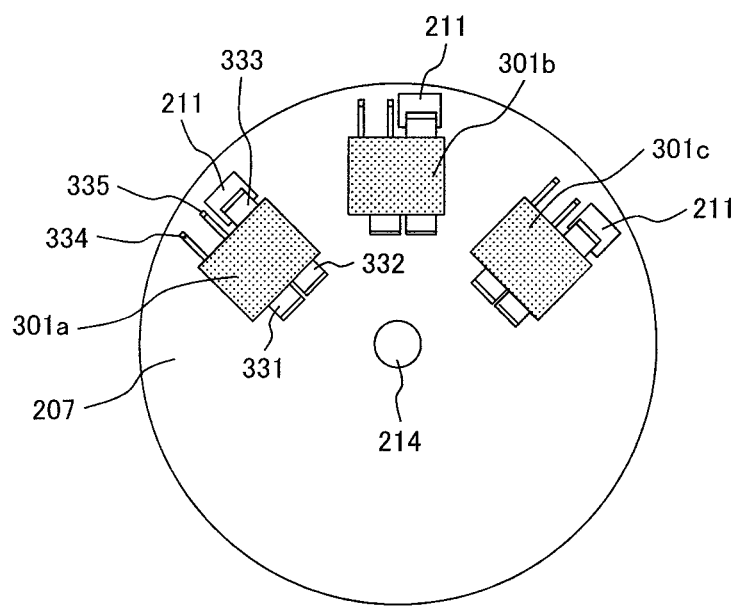
FIG. 5 is a plan view illustrating essential parts to exemplify how the power module according to the first embodiment of the present invention is implemented.

FIG. 5 is a plan view illustrating the power module shown in FIG. 3 when it is mounted on the metal cover 207. A total of three power modules 301a, 301b, 301c, which correspond to the U-, V-, and W-phases, respectively, are mounted on the metal cover 207. A metal cover hole 211 through which a motor wiring runs is formed in a position facing the phase output terminal 333 of each power module on the metal cover 207.

The phase output terminal 333 is electrically connected, for instance, by welding to an output wiring 213 of the terminal busbar 210. Grease or other thermal contact resistance reducing material may be disposed between the metal cover 207 and the power module 301. Further, a hole 214 through which the motor shaft 205 penetrates is formed in the center of the metal cover 207. It is preferred that the power modules 301a-301c be disposed concentrically and symmetrically in order to prevent the interference of heat generated in the power modules and in consideration of output terminal connections. Moreover, the metal cover 207 may have a groove or other indentation for positioning the power modules. Besides, the metal cover 207 may have a groove for providing an adequate insulation distance to the metal wiring (the metal terminals 331-335) for the power modules.

A configuration of the inverter 300 will now be described with reference to FIG. 1. A rectangular metal plate 306 for heat dissipation is disposed on a surface of the power module 301 that is positioned opposite its surface in contact with the metal cover 207. The metal plate 306 is screwed or otherwise fastened to the metal cover 207. Alternatively, the metal plate 306 may be fastened to the power module 301 with adhesive or the like. For example, aluminum, which has a high specific heat, may be used as a material of the metal plate 306. Grease or other thermal contact resistance reducing material may be disposed between the metal plate 306 and the power module 301. Further, a heat dissipation fin may be disposed on a surface of the metal plate 306 that is positioned opposite its surface in contact with the power module 301.

The metal plate 306 may be separately provided for each of the power modules 301a-301c. Alternatively, only one metal plate is provided for a group of the three power modules. Further, the metal plate 306 need not always be rectangular in shape.

The printed circuit board 308 for supplying electrical power to the positive and negative wiring terminals 331, 332 of the power modules 301a-301c is disposed on a surface of the metal plate 306 that is positioned opposite the power module 301. The wiring terminals 331, 332 are electrically connected to the printed circuit board 308, for instance, by soldering or press fitting. For example, a capacitor 309 for smoothing the voltage between the positive and negative terminals of the power module, and an inductor 310 for suppressing noise are soldered to a surface of the printed circuit board 308 that is positioned toward the metal cover 207.

For example, an electrolytic capacitor or a conductive polymer capacitor may be used as the capacitor 309. A groove for providing an adequate distance to an explosion-proof valve for the capacitor 309, or a hole into which the housing for the capacitor 309 is inserted may be formed in a portion of the metal cover 207 that faces the capacitor 309.

The printed circuit board 308 is formed of a plurality of wiring layers (generally an even number of wiring layers).

Positive and negative potential wirings of the printed circuit board 308 that are extended to the power module 301 are disposed in alternate layers. More specifically, a positive potential wiring is disposed in an n-th layer, and a negative potential wiring is disposed in an (n+1)-th layer. Further, the positive and negative potential wirings are laid out to face each other in order to reduce the wiring inductance between the capacitor 309 and the power module 301. Furthermore, the wiring inductances between the capacitor and the individual power modules 301a, 301b, 301c are uniformed so that the individual power modules generate an equal amount of heat. Although not shown, for example, a shunt resistor for current detection and a chip capacitor for noise suppression may be mounted on the printed circuit board 308. Although the printed circuit board 308 is illustrated in the present embodiment as an electrical wiring for supplying electrical power, an alternative is to use, for example, a busbar covered with molding resin, a metal wiring circuit board, or a ceramic circuit board.

A printed circuit board 311 is disposed on a side opposite the metal cover 207 for the printed circuit board 308. Soldered to the printed circuit board 311 are, for example, a driver IC and a microcomputer, which control the semiconductor elements 302a, 302b in the power module 301, and an operational amplifier that amplifies a current value detected by the shunt resistor. Gate wirings 334, 335 for the power module 301 are electrically connected to the printed circuit board 311, for example, by soldering or press fitting. A magnet 212 for position detection is press-fit into the leading end of the shaft 205 of the motor 200 through resin. One or more ICs for detecting the position of a motor rotation axis are mounted on a surface of the printed circuit board 311 that faces the position detection magnet 212.

A connector 307 is attached to each of the printed circuit boards 308, 311 in order to permit signal exchange between the printed circuit boards. Further, when a holed cover 312 is disposed at a position of the connector 307, the power conversion apparatus 100 can be electrically connected to external parts such as a battery and a torque sensor.

In the above-described configuration, heat generated by the power module 301 (301a-301c) for the inverter 300 is dissipated through a heat dissipation path from the motor side metal cover 207 to the motor side metal housing 201 and through a heat dissipation path from the metal plate 306.

As described above, the first embodiment provides the following advantageous effects.

(1) Metals (metal cover 207 and metal plate 306) are disposed on both surfaces of the power module (301) to increase a heat dissipation area and a thermal capacity. Therefore, the heat generated by the power module can be effectively released. This makes it possible to reduce the size of the power module.

(2) The metal terminals (331-335) of the power module are all covered with resin. This decreases the number of additional items required for insulation and heat dissipation. Further, when the resin 304 has a thermal conductivity of 3 W/(m·K) and a thickness of 300 μm, the thermal resistance of the resin decreases. This further improves the heat dissipation performance of the power module.

(3) No metal housing is required for the inverter 300. This results in a simplified structure.

Modification of First Embodiment

Figure 6:
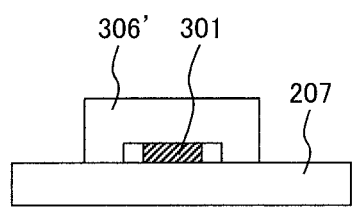
FIG. 6 is a cross-sectional view illustrating essential parts to indicate a different form of a heat dissipation metal plate according to the first embodiment of the present invention.

In the first embodiment, the metal plate 306 is in contact with the power module 301 only. In a modification of the first embodiment, however, as shown in FIG. 6, which illustrates a cross-section structure from which a peripheral portion of the power module 301 is extracted, a metal plate 306' is in planar contact with the metal cover 207 as well. In the first embodiment, a part of the heat generated by the power module 301 that is conducted to the metal plate 306 is released into air in the inverter 300 by heat transfer only. In the modification of the first embodiment, however, the heat conducted to the metal plate 306' is transmitted to the motor side metal housing 201 through the metal cover 207. This makes it possible to use a larger heat dissipation area.

When the above modification of the first embodiment is used, the heat generated by the power module 301 can be released with increased effectiveness. Therefore, the size of the power module can be further reduced. Besides, the metal plate 306' can be used to position the power module 301. Grease or other thermal contact resistance reducing material may be disposed between the metal plate 306' and the metal cover 207, which are in planar contact with each other. Further, a heat dissipation fin may be disposed on a surface of the metal plate 306' that is positioned toward the printed circuit board 308.

Second Embodiment

The following description of a second to seventh embodiments of the present invention does not deal with elements having the same functions as the elements designated by the same reference signs in the above-described figures, out of the power conversion apparatus 100 shown in FIGS. 1 to 5.

Figure 7:
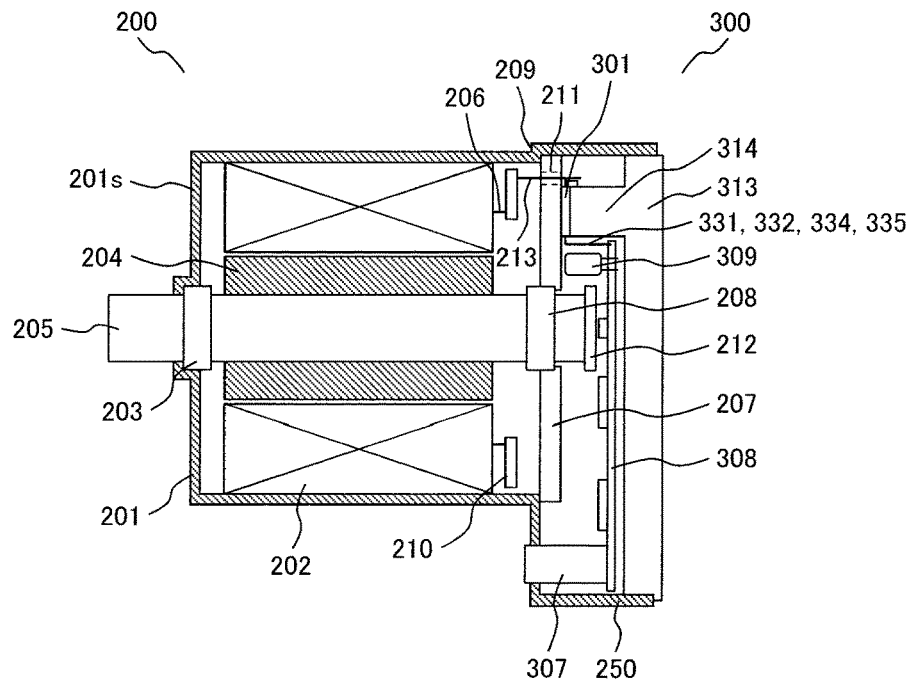
FIG. 7 is a cross-sectional view illustrating the power conversion apparatus according to a second embodiment of the present invention.

FIG. 7 shows an exemplary configuration of the power conversion apparatus according to the second embodiment. FIG. 7 is an axial cross-sectional view of the motor 200. The configuration of the motor 200 is the same as described in conjunction with the first embodiment. The opening in the other axial end of the motor side metal housing 201 is larger in diameter than the opening in the first embodiment (FIG. 1). A metal housing 313 for the inverter is disposed over the opening in the second embodiment instead of the cover 312 shown in FIG. 1.

Instead of the metal plate 306 shown in FIG. 1, a base 314 formed of a metal is disposed on a portion of the metal housing 313 that faces the power module 301. Therefore, one surface of the power module 301 is in contact with the metal cover 207, and the other surface is in contact with the base 314. Here, a groove for positioning the power module 301 may be formed in the base 314. Further, grease or other similar material may be disposed between the power module 301, the metal cover 207, and the base 314. Moreover, the base 314 may be disposed toward the metal cover 207.

The power module 301 in the second embodiment is configured so that the gate terminals 334, 335 are disposed at positions different from those in the first embodiment. More specifically, the gate terminals 334, 335 are positioned toward the positive and negative wiring terminals 331, 332.

The printed circuit board 308 is disposed at a position facing the positive and negative wiring terminals 331, 332 and gate terminals 334, 335 of the power module 301, and screwed or otherwise fastened to the metal housing 313 or the metal housing 201 and to the metal cover 207. Mounted on the printed circuit board 308 are, for example, a wiring for electrically connecting an external power supply to the power module 301, the capacitor 309 for voltage smoothing, and an inductor.

Further, for example, an IC for controlling the semiconductor elements 302a, 302b of the power module 301 and a position detection IC positioned to face the position detection magnet 212 are mounted on the printed circuit board 308, for instance, by soldering. Moreover, in order to dissipate heat to the base 314 disposed on the metal housing 313 through an insulating heat dissipation sheet or the like, a thermal via may be disposed on a surface on which the IC for controlling the semiconductor elements 302a, 302b is mounted and on a surface on which the capacitor 309 is mounted.

The metal housing 313 also functions as a cover and is screwed or otherwise fastened to the metal housing 201 for the motor 200.

In the above-described configuration, the heat generated by the power module 301 for the inverter 300 is dissipated through a heat dissipation path from the motor side metal cover 207 to the motor side metal housing 201 and through a heat dissipation path from the inverter side base 314 to the inverter side metal housing 313 and to the motor side metal housing 201.

As described above, the second embodiment provides the following advantageous effects.

(1) An increase in the number of required parts can be suppressed by using the existing inverter metal housing (313) and without having to add the metal plate (306) for releasing the heat generated by the power module (301).

(2) The heat generated by the power module is conducted to both the inverter metal housing (313) and the motor metal housing (201). Therefore, the heat dissipation area can be increased. This makes it possible to reduce the size of the power module.

(3) Heat generated by the printed circuit board (308) on which, for example, a capacitor is mounted is also conducted to the inverter metal housing (313) and released to the outside. This makes it possible to reduce the size of both the printed circuit board and the capacitor.

Third Embodiment

Figure 8:
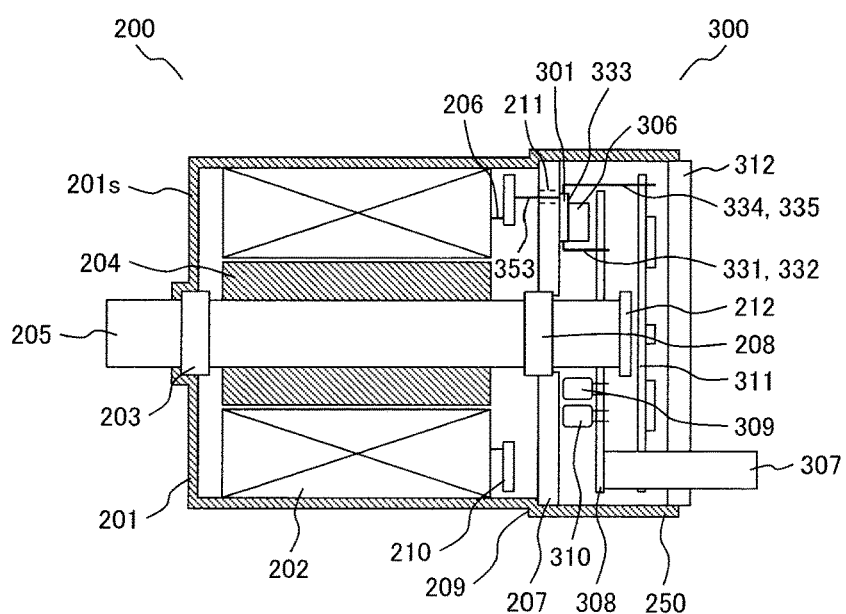
FIG. 8 is a cross-sectional view illustrating the power conversion apparatus according to a third embodiment of the present invention.
Figure 9:
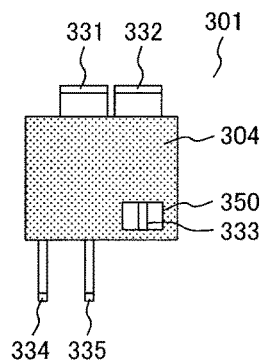
FIG. 9 is a plan view illustrating the power module provided for the power conversion apparatus according to the third embodiment of the present invention.
Figure 10:
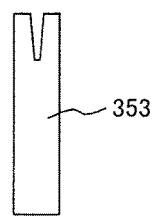
FIG. 10 is a plan view illustrating a leading end of a terminal busbar provided for the power conversion apparatus according to the third embodiment of the present invention.

The third embodiment will now be described with reference to FIGS. 8 to 10. FIG. 8 is a cross-sectional view illustrating the power conversion apparatus according to the third embodiment. FIG. 9 is a top view illustrating the power module. FIG. 10 is a plan view illustrating a leading end of the terminal busbar. In the first and second embodiments, the terminals 331-335 of the power module 301 protrude outward from a lateral surface of the power module and connect to the stator winding of the motor 200 and to the electrical wiring of the printed circuit board.

In the third embodiment, on the other hand, a window 350 is formed at one or more locations through the resin 304 on the phase output terminal 333 of the power module 301 as shown in FIG. 9. Further, as shown in FIG. 10, the leading end of an output wiring 353 of the terminal busbar 210 has a forked structure that fits in with the window 350 of the power module 301.

As the above-described configuration is employed, when the output wiring 353 is inserted into the window 350, a good electrical connection can be established between the phase output terminal 333 of the power module 301 and the output wiring 353 while they are in press contact with each other. In the present embodiment, the window 350 is provided for only the phase output terminal 333 of the power module 301. Alternatively, however, the same window may also be provided for the positive and negative wiring terminals 331, 332 and the gate terminals 334, 335. In such an alternative configuration, the wiring electrically connected to the individual terminals should be shaped to establish a press contact connection. The wiring for the inverter 300 that is to be electrically connected to the positive and negative wiring terminals 331, 332 may be formed of a molded busbar.

As described above, the third embodiment provides the following advantageous effects.

(1) Electrical connections between the power module terminals and the motor side wiring and inverter side wiring can be simultaneously established when individual parts are assembled. This makes it possible to eliminate the necessity of welding and other processes.

(2) The length of the metal wiring for the power module can be reduced. This makes it possible to not only reduce the electrical resistance of the metal wiring, but also achieve cost reduction.

(3) The power module can be structured so that its terminals are not exposed from its lateral surface. This makes it possible to further decrease the mounting area required for the power module.

Fourth Embodiment

Figure 11:
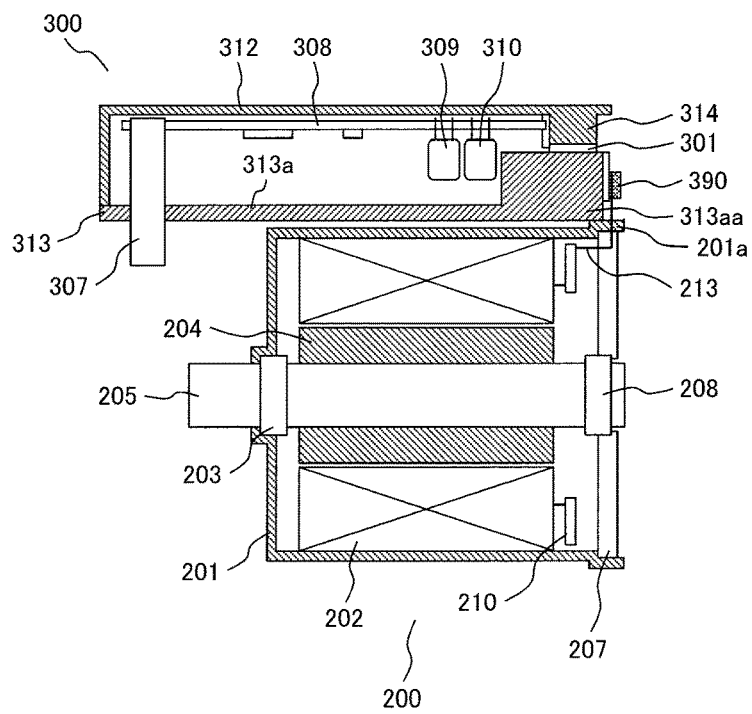
FIG. 11 is a cross-sectional view illustrating the power conversion apparatus according to a fourth embodiment of the present invention.

FIG. 11 shows a cross-section structure of the power conversion apparatus according to the fourth embodiment. In the preceding embodiments, the inverter 300 is disposed in the axial direction of the motor 200. In the fourth embodiment, however, the inverter 300 is disposed in the circumferential direction of the motor 200. The motor 200 has the same configuration as in the first embodiment. However, the fourth embodiment is configured to eliminate the opening in the other axial end of the motor side metal housing 201, which uses the metal cover 207 as a boundary.

In the fourth embodiment, the power module 301 is disposed in the inverter side metal housing 313 for the inverter 300. More specifically, the power module 301 is disposed on the housing inner surface of a thick portion 313aa of one plate 313a that forms the inverter side metal housing. A surface of the power module 301 that is positioned opposite the thick portion 313aa is in contact with the base 314 disposed on the cover 312 (the other plate) that faces the one plate 313a. The one plate 313a of the inverter side metal housing 313 is in contact with and fastened to an outer circumferential plate 201a of the motor side metal housing 201.

The metal wiring 213 from the terminal busbar 210 positioned toward the motor 200 is directed toward the inverter 300 through a hole (not shown) formed in the metal cover 207 and in the outer circumferential plate 201a of the motor side metal housing 201. An end of the metal wiring 213 is electrically connected to a terminal section 390 that is disposed on the outer surface of thick portion 313aa of the one plate 313a of the inverter side metal housing 313a.

A leading end of the phase output terminal 333, which is exposed from the power module 301 to the outside of the metal housing 313, is also connected to the terminal section 390 and secured together with the metal wiring 213, for instance, with a metal screw that is a part of the terminal section 390.

The other terminals 331, 332, 334, 335 of the power module 301 are connected to the printed circuit board 308 disposed in the metal housing 313.

In the above-described configuration, the heat generated by the power module 301 is dissipated from a heat dissipation path passing through the base 314 of the inverter side metal housing 313 and the cover 312 and from a heat dissipation path passing through the thick portion 313aa and the outer circumferential plate 201a of the motor side metal housing 201.

As described above, the fourth embodiment provides the following advantageous effects.

(1) The metal housing for the motor and the metal housing for the inverter can be both utilized for heat dissipation. Thus, the heat generated by the power module can be further released to the outside. This makes it possible to reduce the size of the power module.

(2) The motor and the inverter can be separately prepared and connected. This considerably increases the degree of freedom in selecting and mounting parts.

Fifth Embodiment

Figure 12A:
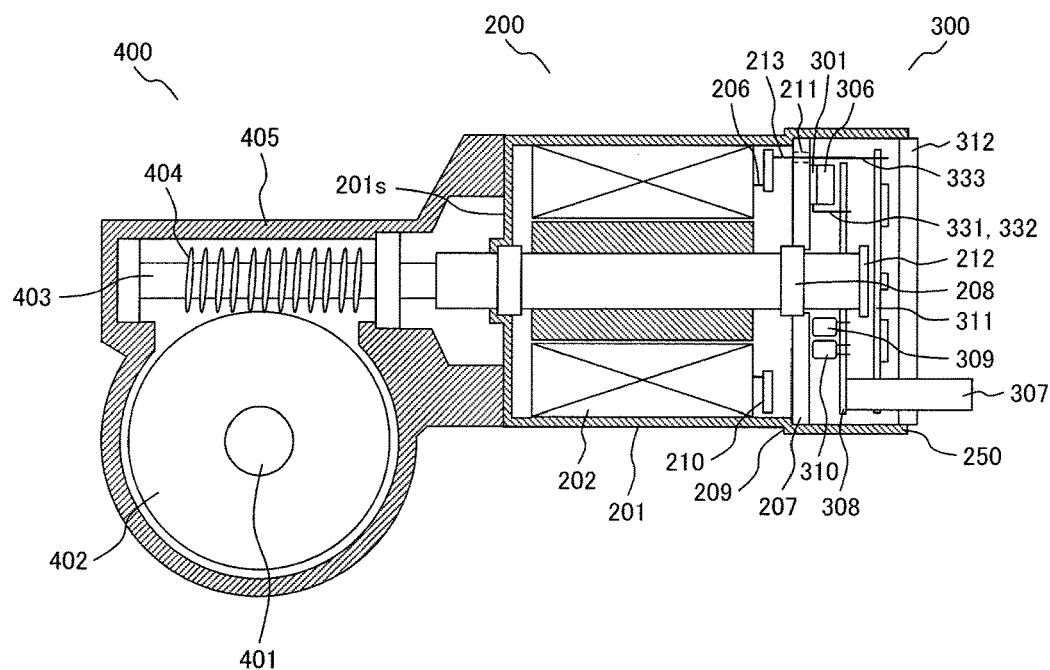
FIGS. 12A and 12B are cross-sectional views illustrating an electric power steering apparatus according to a fifth embodiment of the present invention.

FIG. 12 shows a cross-section structure of the fifth embodiment, which describes an electric power steering apparatus to which the present invention is applied. FIG. 12 shows a part of the electric power steering apparatus. Referring to FIG. 12(a), a speed-reducing mechanism 400 is screwed or otherwise fastened to the metal housing 201 for the power conversion apparatus 100 described in conjunction with the first embodiment (FIG. 1). The speed-reducing mechanism 400 includes a steering shaft 401, a worm wheel 402, a worm gear shaft 403, a worm gear 404, and a speed-reducing mechanism metal housing 405. The speed-reducing mechanism metal housing 405 is formed of aluminum or aluminum alloy.

When a driver of a vehicle manipulates a steering wheel, the electric power steering apparatus applies assist torque to the steering shaft 401 through the speed-reducing mechanism 400 in order to reduce the steering wheel manipulation force required of the driver.

When the above-described configuration is employed, the heat generated by the power module 301 can be conducted to the metal housing 405 for the speed-reducing mechanism 400 through the metal cover 207 and the motor side metal housing 201.

The speed-reducing mechanism 400, the motor 200, and the inverter 300 need not always be laid out as shown in FIG. 12(a). As shown, for example, in FIG. 12(b), the inverter 300 may be disposed between the speed-reducing mechanism 400 and the motor 200.

Figure 12B:
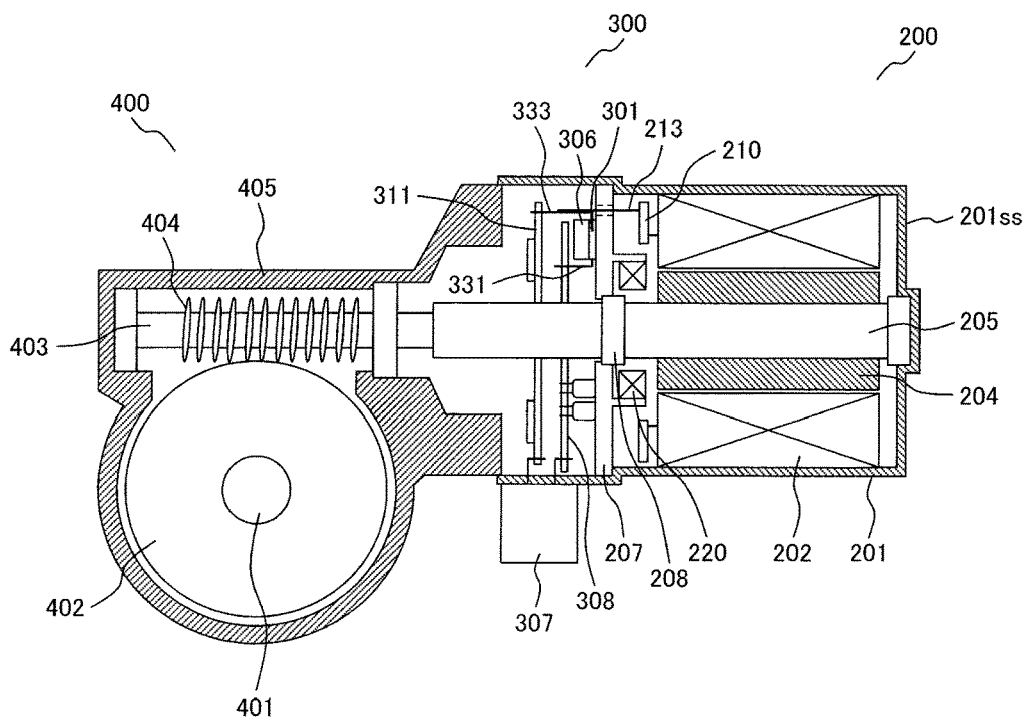

The alternative configuration shown in FIG. 12(b) differs from the configuration shown in FIG. 12(a). More specifically, in the configuration shown in FIG. 12(b), the other axial end of the shaft 205 is hermetically sealed with a blocking section 201ss, the opening in the motor side metal housing 201 is positioned at the one axial end, the same inverter 300 as shown in FIG. 12(a) is disposed in the opening, the connector 307 is disposed on the outer circumference of the housing 201, and the connector 307 is wire-connected to the printed circuit boards 308, 311. The reference sign 220 denotes a resolver.

In the above alternative configuration, the heat generated by the power module 301 is dissipated as one surface of the power module 301 is in contact with the metal cover 207 for the motor and the other surface is in contact with the metal plate 306. Another alternative configuration may be employed so that the power module 301 is mounted on the metal housing 405 for the speed-reducing mechanism 400. In this configuration, the heat generated by the power module 301 is dissipated to the metal housing 405 for the speed-reducing mechanism and to the metal plate 306.

As described above, the fifth embodiment provides the following advantageous effects.

(1) The heat generated by the power module can be conducted from the metal housing 201 to the speed-reducing mechanism 400. This results in a further increase in the dissipation area. Consequently, the size of the power module can be reduced.

(2) The degree of freedom in designing the motor, the inverter, and the speed-reducing mechanism can be considerably increased. Therefore, the present invention can be applied to a variety of products.

Sixth Embodiment

Figure 13:
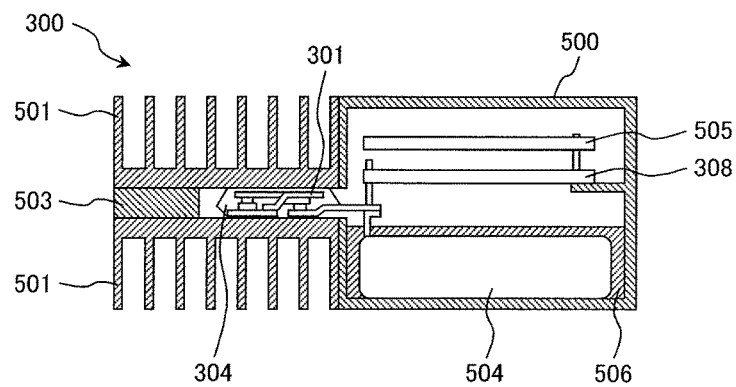
FIG. 13 is a cross-sectional view illustrating an inverter apparatus according to a sixth embodiment of the present invention.

FIG. 13 shows a cross-section structure of the sixth embodiment. FIG. 13 shows a part of the inverter apparatus (300). Referring to FIG. 13, a spacer 503 is disposed adjacent to the power module 301. The spacer 503 has substantially the same thickness as the power module 301. A cooling fin 501 for heat dissipation is disposed on both surfaces of the spacer 503 and power module 301.

The cooling fin 501 is screwed or otherwise secured through the spacer 503. This prevents the pressure applied to the power module 301 from exceeding a design value. Grease or other thermal contact resistance reducing material may be disposed between the power module 301 and the cooling fin 501. Although not shown, a plurality of power modules 301 are disposed. The cooling fin 501 may be provided for each power module 301. Alternatively, two cooling fins (one for one surface of the power modules and the other for the other surface of the power modules) may be provided for the plurality of power modules.

As shown, for instance, in FIG. 2(a), the power module 301 includes two semiconductor elements, terminals connected to the semiconductor elements, and resin 304 that seals the terminals. All the terminals are disposed on one side and introduced into a resin case 500 that is disposed opposite the spacer 503 and adjacent to the cooling fin 501.

Disposed in the resin case 500 are, for example, a film capacitor 504, the printed circuit board 308 on which, for instance, an IC for semiconductor element control is mounted, and a terminal strip 505. The area around the film capacitor 504 is impregnated with resin 506.

The film capacitor 504 is welded or otherwise connected to the output terminal of the power module 301. The printed circuit board 308 is soldered or otherwise connected to the gate terminal of the power module 301.

As described above, the sixth embodiment provides the following advantageous effects.

(1) Heat is released from both surfaces of the fully-molded power module (301). This makes it possible to reduce the size of the power module, that is, the size of the inverter apparatus.

(2) As the fully-molded power module and the cooling fin are utilized, the power module, which generates heat, can be separated from electronic parts. This improves the heat resistance of the electronic parts.

(3) As the cooling fin is separated from the power module, the size of the cooling fin and of the power module can be changed as desired.

Seventh Embodiment

Figure 14:
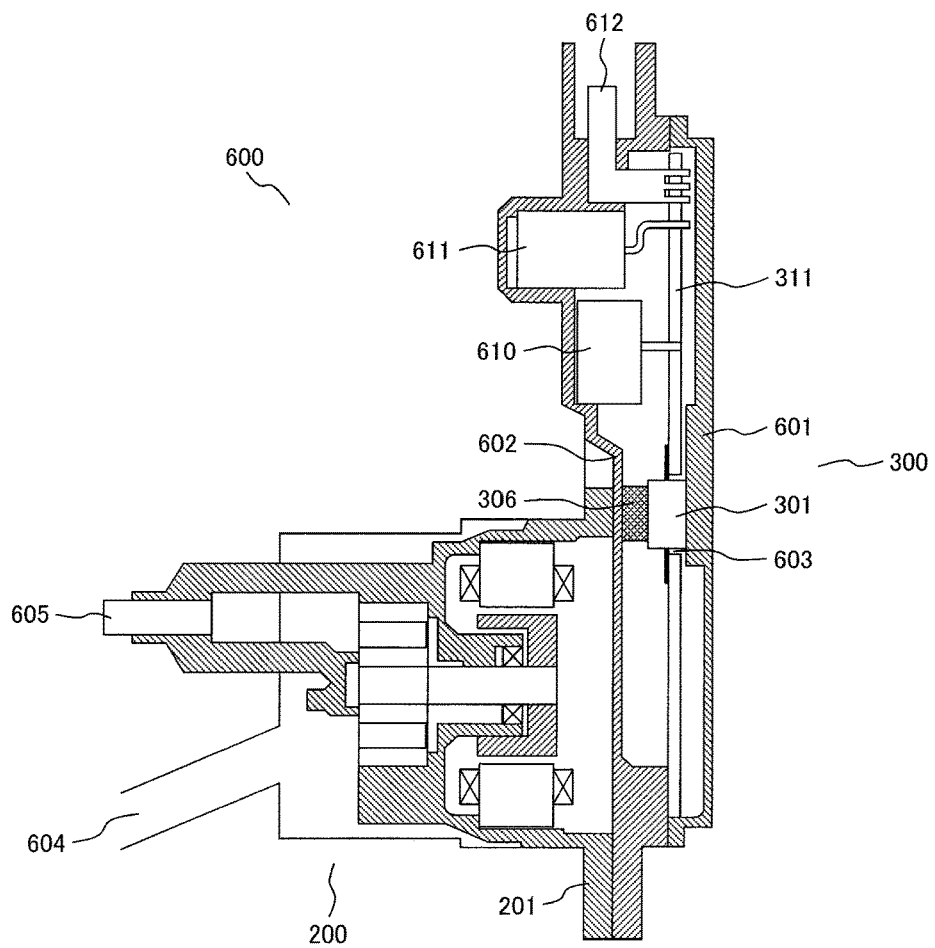
FIG. 14 is a cross-sectional view illustrating a mechatronically integrated drive apparatus according to a seventh embodiment of the present invention.

FIG. 14 shows a cross-section structure of the seventh embodiment, which describes a mechatronically integrated drive apparatus in an oil pump system to which the present invention is applied. Referring to FIG. 14, the mechatronically integrated drive apparatus 600 includes the motor 200 and the inverter 300. The inverter 300 is used to drive the motor 200 so as to control the amount of oil flowing from an intake section 604 to a discharge section 605.

A metal housing for the inverter 300 is formed of a flat heat sink 601 and a case 602. The printed circuit board 311, which is in parallel with the heat sink 601, is disposed in the metal housing. A hole 603 is formed substantially in the center of the printed circuit board 311. At least one power module for power conversion is disposed through the hole 603.

One surface of the power module 301 is in contact with the heat sink 601. The metal plate 306 is disposed on the other surface of the power module 301. One surface of the metal plate 306 is in contact with the power module 301, and the other surface is in contact with the case 602 formed of metal. The motor 200 is disposed on the case 602, which is in contact with the motor side metal housing 201.

The power module 301 includes, the semiconductor elements and terminals shown, for instance, in FIG. 2(a), and resin that seals the semiconductor elements and terminals. The terminals, which are formed of metal, are linearly exposed to the outside and connected to the printed circuit board 311.

Consequently, the terminals of the power module 301 are flush with the electrical connection surface of the printed circuit board 311. Thus, the terminals need not be bent or otherwise worked.

For example, a capacitor 610, an inductor 611, a connector 612, and a control IC are mounted on the printed circuit board 311. Therefore, the printed circuit board 311 is capable of exercising minute control over the motor 200. The heat sink 601 is formed of aluminum or other thermally conductive metal having a large thermal capacity. The case 602 is formed of iron or other inexpensive, readily workable metal.

In the above-described configuration, one surface of the power module 301 is in direct contact with the heat sink 601 without placing the printed circuit board 311 between them. Therefore, the heat generated by the semiconductor elements in the power module can be effectively released. Further, a heat transfer path is provided between the other surface of the power module 301 and the case 602. This further enhances the effect of heat dissipation.

The metal plate 306 may be a part of the case 602. Further, grease or the like may be disposed between the power module 301 and the heat sink 601. Furthermore, the metal housing 201 for the motor 200 may play the role of the case 602.

As described above, the seventh embodiment provides the following advantageous effects.

(1) Heat is released from both surfaces of the fully-molded power module 301 without being transferred through the printed circuit board 311. This makes it possible to reduce the size of the power module, that is, to reduce the size of the inverter apparatus.

(2) The metal terminals of the power module are flush with the electrical connection surface of the printed circuit board. Therefore, the metal terminals need not be bent or otherwise worked. This makes it possible to reduce cost and man-hours.

REFERENCE SIGNS LIST

100 . . . power conversion apparatus,
200 . . . motor,
201 . . . motor side metal housing,
201s, 201ss . . . blocking section,
202 . . . stator,
203, 208 . . . bearing,
204 . . . rotor,
205 . . . shaft,
206 . . . stator winding output section,
207 . . . metal cover,
209 . . . spigot structure,
210 . . . terminal busbar,
11 . . . metal cover hole,
212 . . . position detection magnet,
213 . . . metal wiring,
14 . . . hole,
300 . . . inverter,
301 . . . power module,
302a-302c . . . semiconductor element,
304 . . . resin,
305 . . . resin thickness,
306, 306' . . . metal plate,
307, 612 . . . connector,
308, 311 . . . printed circuit board,
309, 610 . . . capacitor,
310, 611 . . . inductor,
312 . . . cover,
313 . . . inverter side metal housing,
313a . . . one plate,
313aa . . . thick portion,
314 . . . base,
331 . . . positive wiring terminal,
332 . . . negative wiring terminal,
333 . . . phase output terminal,
334, 335 . . . gate terminal,
350 . . . power module window,
353 . . . output wiring,
390 . . . terminal section,
400 . . . speed-reducing mechanism,
401 . . . steering shaft,
402 . . . worm wheel,
403 . . . worm gear shaft,
404 . . . worm gear,
405 . . . metal housing for speed-reducing mechanism,
500 . . . resin case,
501 . . . cooling fin,
503 . . . spacer,
504 . . . film capacitor,
505 . . . terminal strip,
506 . . . resin,
600 . . . mechatronically integrated drive apparatus,
601 . . . heat sink,
602 . . . case,
603 . . . hole,
604 . . . intake section,
605 . . . discharge section.

The invention claimed is:

1. A power conversion apparatus comprising:
a motor; and
an inverter;
wherein at least one power module for the inverter is disposed on a metal housing for the motor; and
wherein a metal plate for heat dissipation is disposed on a surface of the power module that is positioned opposite a surface of the power module that is in contact with the metal housing;
wherein the power module includes semiconductor elements, a metal wiring connected to electrodes of the semiconductor elements, and insulating resin that seals the semiconductor elements and the metal wiring; and
wherein a surface of the motor that is in contact with the metal housing and a surface of the motor that is in contact with the metal plate are covered with the insulating resin; and
wherein the resin of the power module is provided with a window that exposes the metal wiring sealed with the resin; and wherein a wiring connected to a winding of the motor is inserted into the window and joined to the metal wiring.

2. The power conversion apparatus according to claim 1, wherein the semiconductor elements in the power module include an upper arm side semiconductor element, a lower arm side semiconductor element, and a motor output side semiconductor element, the motor output side semiconductor element being connected between a phase output terminal and a common connection point for the upper and lower arm side semiconductor elements.

3. A power conversion apparatus comprising:
a semiconductor element;
a metal wiring that is connected at one end to an electrode of the semiconductor element;
a power module having insulating resin that seals the semiconductor element and the metal wiring; and
a heat dissipation fin disposed on both surfaces of the power module;
wherein the power module and the heat dissipation fin are in contact with each other through the resin;
wherein the other end of the metal wiring is routed outward from the power module;
wherein the metal wiring routed from the drain and source electrodes of the semiconductor element is connected to a capacitor; and
wherein the metal wiring routed from the gate electrode of the semiconductor element is connected to a circuit board on which a part for controlling the semiconductor element is mounted, the capacitor and the circuit board being integrally housed in a case formed of resin.

4. The power conversion apparatus according to claim 3, wherein a spacer is disposed between the heat dissipation fins disposed on either surface of the power module.

* * * * *